(12) United States Patent
Jones et al.

(10) Patent No.: US 6,466,051 B1
(45) Date of Patent: Oct. 15, 2002

(54) MULTIPLEXERS FOR EFFICIENT PLD LOGIC BLOCKS

(75) Inventors: Christopher W. Jones, Pleasanton, CA (US); Rochan Sankar, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/788,838

(22) Filed: Feb. 20, 2001

(51) Int. Cl.[7] ............................................... G06F 9/302
(52) U.S. Cl. ........................................ 326/41; 326/39
(58) Field of Search ............................... 326/38, 39, 41

(56) References Cited

U.S. PATENT DOCUMENTS

| | | | | |
|---|---|---|---|---|
| 5,926,036 A | * | 7/1999 | Cliff et al. | 326/40 |
| 5,966,027 A | | 10/1999 | Kapusta et al. | 326/39 |
| 6,034,546 A | * | 3/2000 | Jones et al. | 326/39 |
| 6,043,676 A | * | 3/2000 | Mendel et al. | 326/39 |
| 6,201,408 B1 | | 3/2001 | Skahill et al. | 326/39 |
| 6,201,409 B1 | | 3/2001 | Jones et al. | 329/36 |
| 6,211,696 B1 | | 4/2001 | Skahill et al. | 326/41 |
| 6,243,304 B1 | | 6/2001 | Patel et al. | 365/189.08 |

OTHER PUBLICATIONS

"MAX 7000 Programmable Logic Device Family", Altera Corporation, Aug. 2000, ver. 6.02, pp. 1–85.

"MAX 9000 Programmable Logic Device Family", Altera Corporation, Jul. 1999, ver. 6.01, pp. 1–41.

"Preliminary Ultra37000™ CPLD Family", Cypress Semiconductor Corp., Aug. 13, 1999, pp. 1–65.

"5000V Family Architectural Description", Lattice Semiconductor Corp., Nov. 1999, pp. 1–7.

"ispMACH™ 4A CPLD Family", Lattice Semiconductor Corp., Apr. 2001, pp. 1–61.

"CoolRunner® XPLA3 CPLD", XILINX, Apr. 11, 2001, pp. 1–10.

"XC9500 In–System Programmable CPLD Family", XILINX, Sep. 15, 1999 (Version 5.0), pp. 1–16.

Roger Bettman et al., "Reduced Product Term Carry Chain", U.S. Ser. No. 09/587,708, Filed Jun. 5, 2000.

Christopher W. Jones et al., "Multiplexers for Efficient PLD Logic Blocks", U.S. Ser. No. 09/789,052, Filed Feb. 20, 2001.

* cited by examiner

*Primary Examiner*—Michael Tokar
*Assistant Examiner*—Anh Q Tran
(74) *Attorney, Agent, or Firm*—Christopher P. Maiorana, P.C.

(57) ABSTRACT

A logic section of a programmable logic device comprising a first circuit and a second circuit. The first circuit may be configured to (i) implement user defined programmable logic and (ii) generate an output in response to a first input and a second input. The second circuit may be configured to generate the second input in response to the output, a third input, and a fourth input.

20 Claims, 12 Drawing Sheets

MULTIPLEXERS FOR EFFICIENT PLD LOGIC BLOCKS

CROSS REFERENCE TO RELATED APPLICATIONS

The present application may relate to co-pending application Ser. No. 09/789,052, filed concurrently, which is hereby incorporated by reference in its entirety.

FIELD OF THE INVENTION

The present invention relates to a method and/or architecture for programmable logic device (PLD) logic blocks generally and, more particularly, to a method and/or architecture implementing multiplexers for efficient PLD logic blocks.

BACKGROUND OF THE INVENTION

Referring to FIG. 1, a block diagram illustrating a product term based complex programmable logic device (CPLD) 10 is shown. The CPLD 10 has a programmable interconnect matrix (PIM) 12 and a number of logic blocks 14. The logic blocks 14 include an AND-array 16, an OR-array 18, and a macrocell 20.

Referring to FIG. 2, a diagram of the AND-array 16 is shown. The AND-array 16 receives a number of input terms (ITs) M1 and generates a number of product terms (PTs) M2. The size of the AND-array 16 is determined by the number of ITs and PTs. Reducing the size of the AND-array 16 in both the input and output directions improves performance and cost.

Product term based CPLD architectures can consume more area and achieve lower speed performance compared to LUT-based FPGA architectures. The primary reason for the difference is the large size of the AND-array, in terms of both: (a) the number of product terms (PTs) generated per macrocell; and (b) the number of input terms (ITs) to the AND-array.

Referring to FIG. 3, a three-dimensional bar graph 30 comparing the Area*Delay$^2$ product versus the number of inputs (ITs) and product terms (PTs) for a 6-macrocell logic block is shown. With respect to the number of product terms generated per macrocell, the area and delay performance are optimized when the number of product terms per macrocell is set to as few as 2 (e.g., Bar 32). However, two product terms per macrocell is lower than the typical value of 4 or 5 product terms per macrocell used in current industry-standard CPLDs. A disadvantage of the 2-PT/macrocell architecture is that several basic state machines require slightly more than two product terms per state bit. Such state machines include various classes of counters and shift registers that are commonly used as building blocks in sequential circuits. The counters and shift registers commonly must be implementable in a single logic block of a CPLD. A comparison of the output equation, number of product terms per macrocell, and number of AND-array inputs associated with each type of counter is shown in the following TABLE 1:

TABLE 1

| Counter Type | T-FF Output Equation for Bit i | # PTs per Macrocell | # AND-Array Inputs |
|---|---|---|---|
| Simple n-bit up-counter | $T_i = Q_{i-1} * Q_{i-2} * \ldots * Q_0$ | 1 | n |
| Simple n-bit up/down-counter | $T_i = dir * Q_{i-2} * Q_{i-2} * \ldots * Q_0 +$ /dir $* /Q_{i-1} * /Q_{i-2} * \ldots * /Q_0$ | 2 | n + i |
| Loadable n-bit up-counter | $T_i = /load * Q_{i-1} * Q_{i-2} * \ldots * Q_0 +$ load $* Q_i * /data(i) +$ load $* /Q_i * data(i)$ | 3 | 2n + 1 |
| Loadable n-bit up/down-counter | $T_i = /load * dir * Q_{i-1} * Q_{i-2}$ $* \ldots * Q_0 +$ /load $* /dir * /Q_{i-1} * /Q_{i-2}$ $* \ldots * /Q_0 +$ load $* Q_i * /data(i) +$ load $* /Q_i * data(i)$ | 4 | 2n + 2 |

A similar comparison for various classes of shift registers is shown in the following TABLE 2:

TABLE 2

| Shift Register Type | D-FF Output Equation for Bit i | # PTs/Macrocell | # AND-Array Inputs |
|---|---|---|---|
| Simple n-bit right-shift register | $D_i = Q_{i-1}$ | 1 | n |
| Simple n-bit bidirectional shift register | $d_i = dir * Q_{i-1} +$ /dir $* Q_{i+1}$ | 2 | n + 1 |
| Loadable n-bit right-shift register | $D_i = /load * Q_{i-1} +$ load $* data(i)$ | 2 | 2n + 1 |
| Loadable n-bit bidirectional shift register | $D_i = /load * dir * Q_{i-1} +$ /load $* /dir * Q_{i-1} +$ load $* data(i)$ | 3 | 2n + 2 |

To accommodate the product term requirements of the state machines of TABLES 1 and 2, the traditional solution has been to use a large AND-array, typically having 4 to 5 unique product terms per macrocell. However, as shown in FIG. 3, having 4 to 5 unique product terms per macrocell can result in large logic area and poor overall speed performance of the CPLD.

With respect to the number of AND-array inputs, conventional logic block architectures require a high number of AND-array inputs in order to simultaneously route (i) sufficient input terms for combinatorial functions, and (ii) sufficient input/load data terms and macrocell feedbacks for sequential functions. TABLES 1 and 2 show that at least (2n+2) unique AND-array inputs must be present in an n-macrocell logic block to implement various counters and shift registers. Conventional architectures actually employ more than (2n+2) AND-array inputs (typically 2.25n to 3n) to guarantee full routability into the logic block.

There are several existing CPLD logic block architectures, all of which fall into two categories: (a) a sum-of-products logic block architecture that has a large AND-array, where input terms and macrocell feedbacks are routed via a global interconnect matrix; and (b) a sum-of-products logic block architecture that has a large AND-array, where input terms are routed via a global interconnect matrix and macrocell outputs are fed back locally or globally.

Referring to FIG. 4, a diagram of a conventional sum-of-products logic block architecture 40 is shown. The sum-ofproducts logic block architecture 40 has a large product term array 42, where input terms and macrocell feedbacks are routed via a global interconnect matrix. The logic block 40 receives 36 inputs from the programmable interconnect matrix (PIM), with each signal delivered in both true and complement form to the product term array 42 (totaling 72 AND-array inputs). The product term array 42 generates 80 general-purpose product terms that are allocated across sixteen macrocells 44, resulting in an average of five PTs/macrocell. There are an additional seven control product terms allocated for reset, preset, product term clock, and output enable signals. To implement a synchronous load for a state machine, the LOAD signal and data lines are routed through the PIM, the product term array 42, and the product term allocator 46 to form the desired sum-of-products expression for each state machine bit. In addition, macrocell feedbacks can only route back into the logic block via the PIM. The macrocell feedbacks form a subset of the 36 inputs to the logic block.

Referring to FIG. 5, a diagram illustrating another conventional sum-of-products logic block architecture 50 is shown. The sum-of-products logic block architecture 50 has a large AND-array, where input terms are routed via a global interconnect matrix and macrocell outputs are fed back locally or globally. The logic block 50 receives thirty-three input terms from a global routing pool, sixteen expander product terms from the local array, and sixteen local macrocell feedbacks. The input terms and macrocell feedbacks are delivered in both true and complement form to the product term array (totaling 114 AND-array inputs). The AND-array architecture of the logic block 50 is slightly different from the logic block 40 due to the presence of parallel expanders 52 and shareable expanders 54. However, the use of the parallel and shared expanders still results in an average of five product terms allocated per macrocell. As is the case with the logic block 40 architecture of FIG. 4, a synchronous load function requires the load control and data signals to propagate through the global routing pool, the product term array, and the product term select matrix. However, unlike the logic block 40, each macrocell output has a dedicated feedback path to both the global routing pool and the local AND-array.

The primary disadvantage of conventional CPLD logic block architectures 40 and 50 is that the large size of the AND-array, in both the input and output directions, results in high area consumption and poor speed performance of the overall CPLD. None of the existing architectures have a specialized datapath to implement synchronous load functions for a state machine, that would reduce the size requirement of the AND-array. For example, implementing a 16-bit loadable counter or shift register using a single logic block 40 can require as many as sixty-four unique product terms and thirty-four unique PIM inputs (e.g., see TABLES 1 and 2). The AND-array 42 is forced to be large in both the input and output directions (72 inputs, 80 product terms) to subtend the state machine implementations. As evidenced by FIG. 3, the 5-PT/macrocell architecture can result in poor overall area/delay performance of the CPLD. Furthermore, the full routability of state machine outputs into the same logic block is not guaranteed, since the outputs must first route through a large interconnect matrix which can deliver only a fixed number of inputs to a logic block. Maximizing the routability of macrocell feedbacks into the logic block also forces the AND-array 42 to be large in the input direction. Another disadvantage of the logic block 40 is that the macrocell feedbacks incur a long propagation delay through the PIM. The long propagation delay can degrade the maximum operating frequency of the state machine.

When the 16-bit loadable counter or shift register is implemented using a single logic block 50 of FIG. 5, the same product term and input requirements listed in TABLES 1 and 2 apply, with the exception that local macrocell feedback paths can be used to route the state machine outputs. The sixteen local feedbacks guarantee full routability of state machine outputs back into the logic block, and eliminate any propagation delay otherwise incurred through the global routing pool. However, because the local feedbacks are dedicated, and because there are sixteen additional expander product terms present as inputs, the AND-array of the logic block architecture 50 is even larger and more inefficient in the input direction (114 inputs) as compared to the logic block architecture 40 (72 inputs). The 5-PT/macrocell configuration also forces the AND-array of the logic block architecture 50 to be large in the output direction, leading to the same pitfalls in CPLD area and delay performance.

It would be desirable to have a logic block architecture that reduces the number of AND-array inputs below (2n+2)-making the overall architecture faster and more area-efficient-while maintaining the capacity and physical routability for implementing the basic state machines listed in Tables 1 and 2.

SUMMARY OF THE INVENTION

The present invention concerns a logic section of a programmable logic device comprising a first circuit and a second circuit. The first circuit may be configured to (i) implement user defined programmable logic and (ii) generate an output in response to a first input and a second input. The second circuit may be configured to generate the second input. in response to the output, a third input, and a fourth input.

The objects, features and advantages of the present invention include providing multiplexers for efficient PLD logic blocks that may (i) provide a programmable logic device (PLD) logic block architecture capable of faster, more routable, and more area-efficient implementations of counters, shift registers, and other state machines as compared to conventional sum-of-products PLD architectures, (ii) perform input-term multiplexing at macrocell inputs, (iii) allow loadable unidirectional or bidirectional counters and shift registers to be built without consuming additional product terms in generic logic, (iv) multiplex macrocell feedbacks directly into the product term array, (v) guarantee routability of state machine outputs, (vi) provide fast feedback paths within the logic block, and (vii) significantly reduce the AND-array size in a sum-of-products architecture, resulting in smaller die area and faster operation compared to existing PLD architectures.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
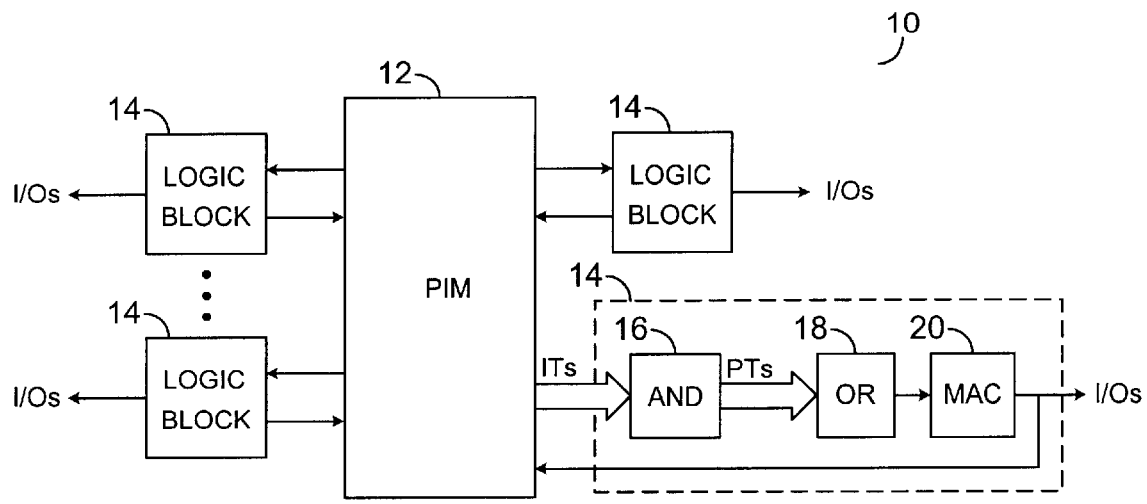
FIG. 1 is a block diagram illustrating a product term based programmable logic device.
Figure 2:
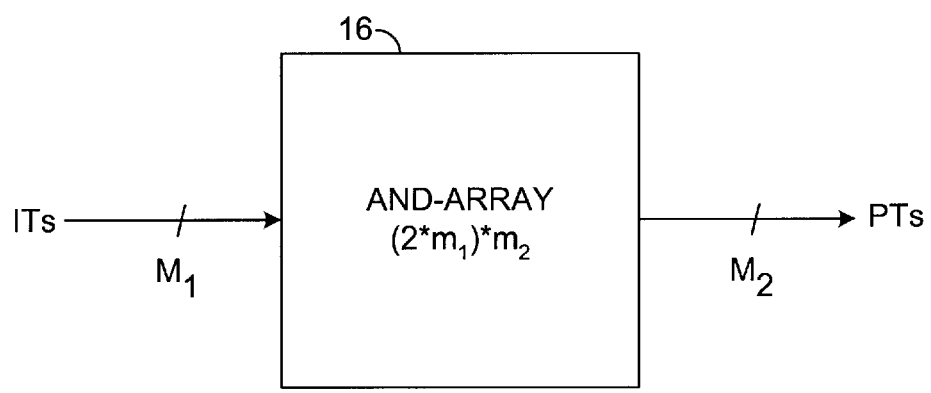
FIG. 2 is a block diagram illustrating an AND-array of FIG. 1.
Figure 3:
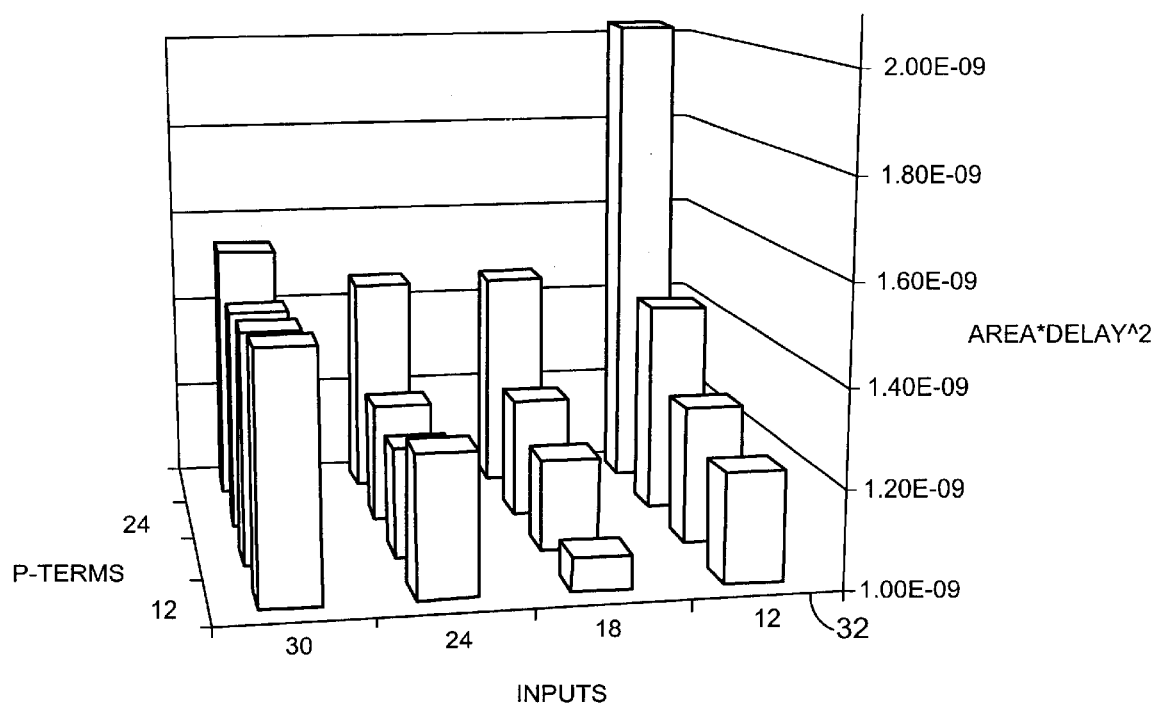
FIG. 3 is a three-dimensional bar chart illustrating a comparison of area and delay performance to number of inputs and product terms.
Figure 4:
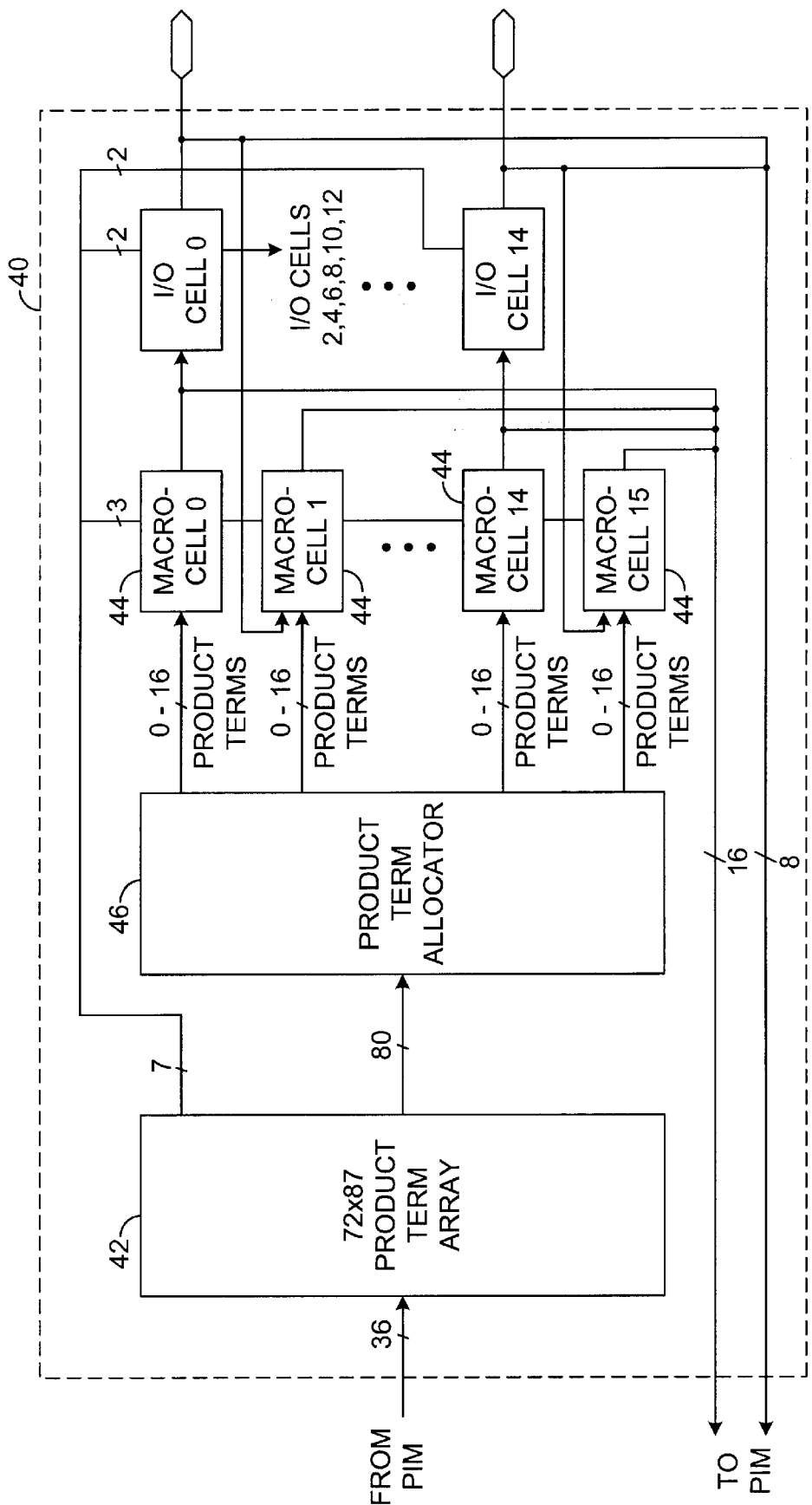
FIG. 4 is a diagram illustrating a conventional logic block.
Figure 5:
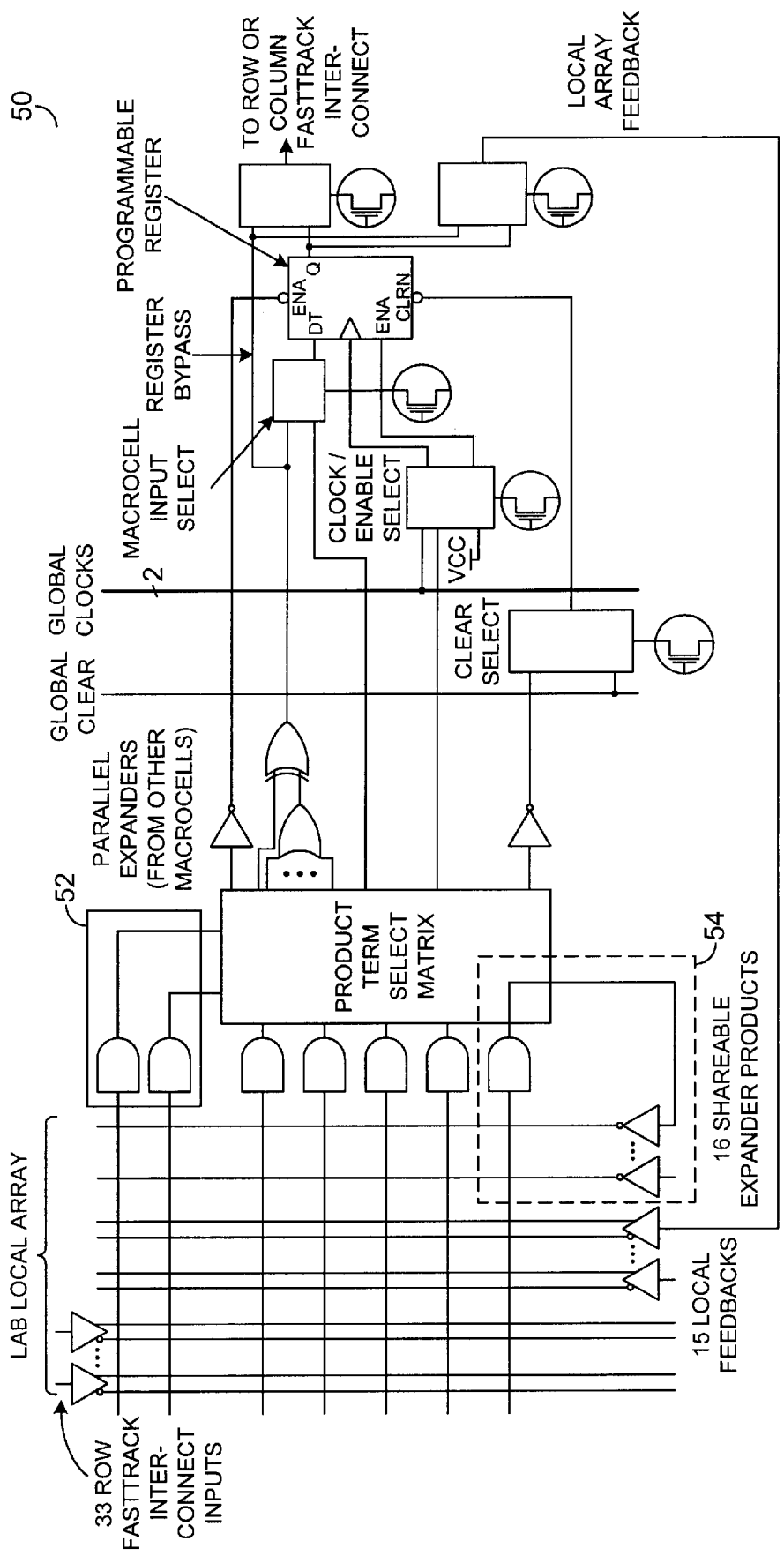
FIG. 5 is a diagram illustrating another conventional logic block.
Figure 6:
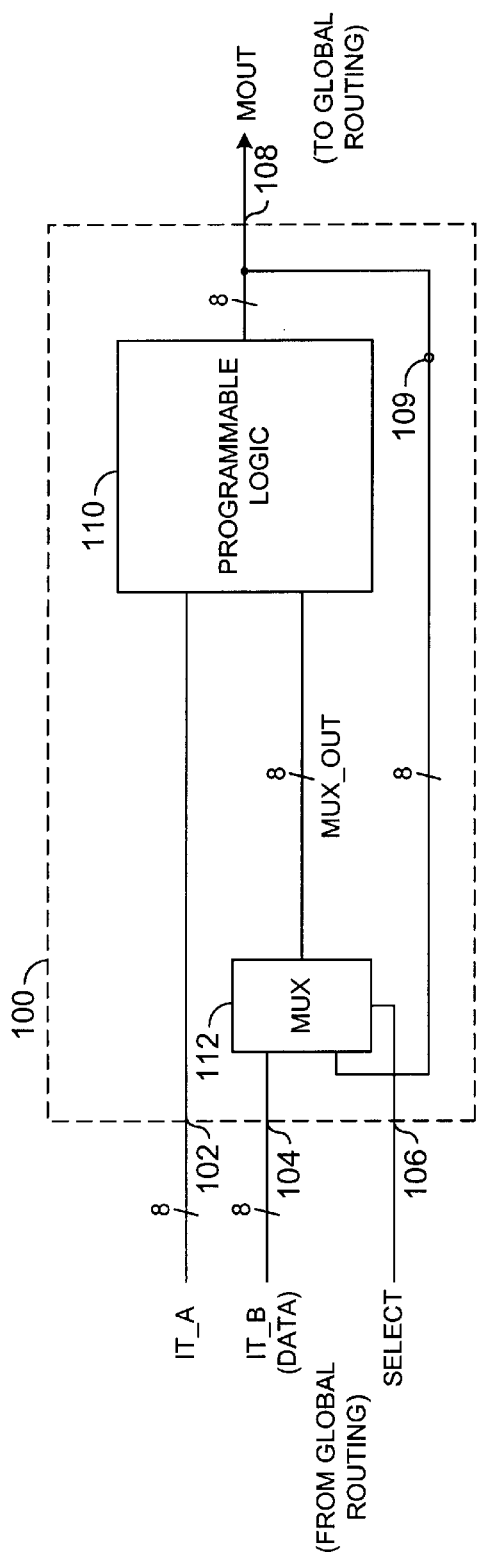
FIG. 6 is a block diagram illustrating a preferred embodiment of the present invention.

Referring to FIG. 6, a block diagram of a circuit 100 illustrating a preferred embodiment of the present invention is shown. The circuit 100 may be implemented, in one example, as a logic block of a complex programmable logic device (CPLD). The circuit 100 may be used to implement state machines using as few as two product terms per macrocell. The state machines that may be implemented may include, but are not limited to, the state machines listed in TABLES 1 and 2 above.

The circuit 100 may have an input 102, an input 102, an input 106, and an output 108. A signal (e.g., IT_A) may be presented to the input 102. A signal (e.g., IT_B or DATA) may be presented to the input 104. A signal (e.g., SELECT) may be presented to the input 106. A signal (e.g., MOUT) may be presented at the output 108. The signals IT_A, IT_B, DATA, and SELECT may be received from a programmable interconnect matrix (PIM) or other types of global routing. The signal MOUT may be presented to the PIM or global routing. The signals IT_A, IT_B, DATA, and MOUT may be multi-bit signals. In one example, the signals IT_A, IT_B, DATA, and MOUT may be 8-bit signals. However, other numbers of bits may be implemented.

The signals IT_A and IT_B may be input signals (e.g., input terms) of PLD. The signal MOUT may be an output signal of a PLD. The signal MOUT may be generated by one or more macrocells of a PLD. The signal SELECT may be a user-defined control signal. The signal DATA may comprise user-defined loadable data. The circuit 100 may be configured to generate the signal MOUT in response to one or more of the signals IT_A, IT_B, MOUT, and SELECT.

The circuit 100 may comprise a local feedback path 109, a block (circuit) 110 and a block (array) 112. The block 110 may be a programmable logic circuit. The block 112 may be a multiplexer block. The circuit 110 may be configured to implement user-defined sequential logic and/or combinational logic circuits. For example, the circuit 110 may implement logic circuits in response to a number configuration bits programmed to meet the design criteria of a particular user application. The signal IT_A may be presented to a first input of the circuit 110. A signal (e.g., MUX_OUT) may be present to a second input of the circuit 110. The circuit 110 may have an output that may present the signal MOUT. The circuit 110 may be configured to generate the signal MOUT in response to the signals IT_A and MUX_OUT. The signal MOUT may be coupled from the output of the circuit 110 to the input of the circuit 112 by the local feedback path 109.

The multiplexer circuit 112 may be implemented, in one example, as a 16:8 input multiplexer that may be configured to select between 8 generic input terms from a global routing pool and 8 local macrocell feedbacks to generate 8 AND-array inputs. Alternatively, the multiplexer circuit 112 may comprise a number of multiplexers. The number of inputs and outputs of the multiplexer 112 may be varied to meet the design criteria of a particular application. The multiplexer circuit 112 may have a first input that may receive the signal IT_B, a second input that may receive the signal MOUT, and a third input that may receive the signal SELECT. The third input of the multiplexer circuit 112 may be implemented as a control input. The multiplexer circuit 112 may have an output that may present the signal MUX_OUT to the second input of the circuit 110. The signal MUX_OUT may be a multi-bit signal. In one example, the signal MUX_OUT may be an 8-bit signal. The signal MUX_OUT will generally have the same number of bits as either of the signals IT_B or MOUT. The signal MOUT may be coupled from the output of the circuit 110 to the input of the circuit 112 via a local feedback path of the logic block 100.

Figure 7:
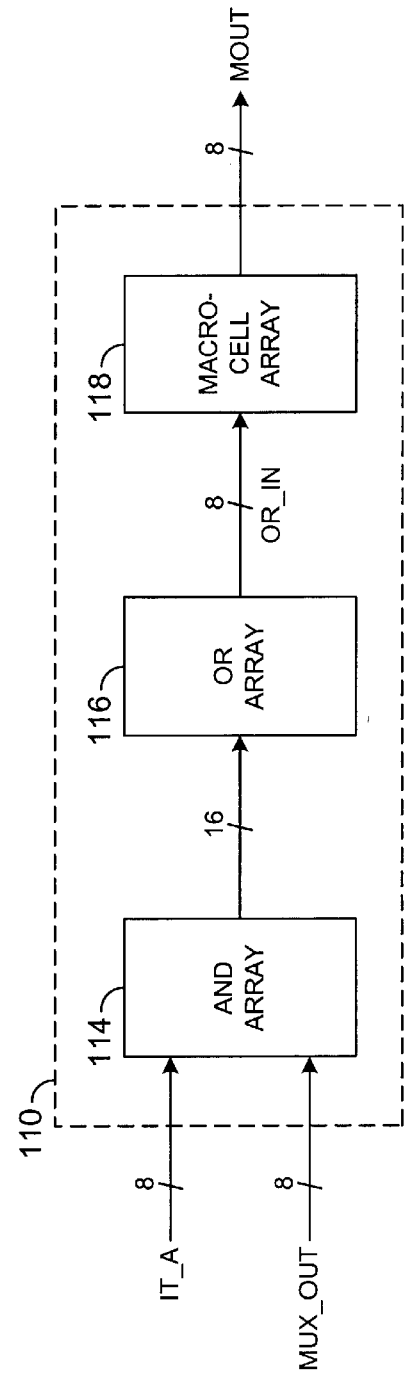
FIG. 7 is a detailed block diagram illustrating an implementation of a programmable logic circuit of FIG. 6.

Referring to FIG. 7, a detailed block diagram illustrating an implementation of the circuit 110 of FIG. 6 is shown. The circuit 110 may comprise an AND-array 114, an OR-array 116, and an array of macrocells 118. The AND-array 114 may be implemented, in one example, as a 32×16 AND-array. The AND-array 114 may be configured, in one example, to (i) receive 8 generic input terms from a global routing pool and 8 outputs from the multiplexer circuit 112, (ii) produce each input signal in a true and a complement form, and (iii) generate 16 unique product terms. However, other AND-array sizes and numbers of signals may be implemented accordingly to meet the design criteria of a particular application.

The product terms generated by the AND-array 114 may be presented to the OR-array 116. In one example where the number of product terms is sixteen, the OR-array 116 may be configured to allocate the sixteen product terms among a number of logic block macrocells in the macrocell array 118. In one example, the product terms may be allocated among eight macrocells. However, the number of macrocells may be varied to meet the design criteria of a particular application.

The array of macrocells 118. may be implemented, in one example, as an array of 8-macrocells. Each of the macrocells may be configured to (i) receive an output of the OR-array 116, (ii) produce a combinatorial or registered output signal (e.g., MOUTi), and (iii) route the output signal to (a) the global routing pool and (b) the local feedback path 109 to the multiplexer 112.

Figure 8:
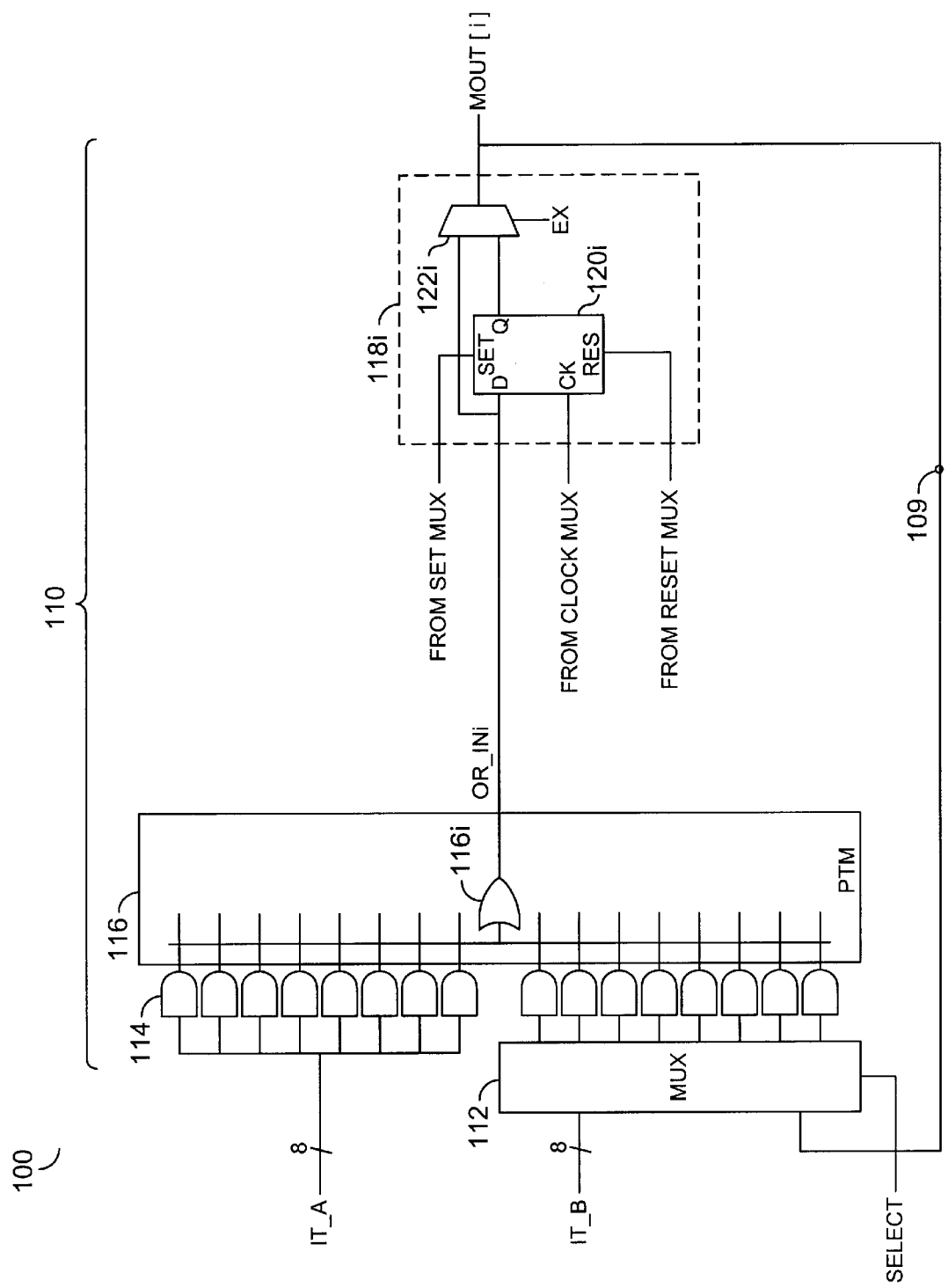
FIG. 8 is a more detailed block diagram illustrating an implementation of the programmable logic circuit of FIG. 7.

Referring to FIG. 8, a more detailed diagram of the circuit 100 is shown. The OR-array 116 generally comprises a number of OR gates. The macrocell array 118 generally comprises a to number of macrocells. An output of an OR gate 116*i* may present a signal (e.g., OR_INi) to an input of a macrocell 118*i*. The macrocell 118*i* may be configured to generate a portion of the signal MOUT (e.g., MOUT[i]) in response to the signal OR_INi.

The macrocell 118*i* may comprise a memory element 120*i* and a multiplexer 122*i*. The memory element 120*i* may be implemented as a flip-flop, register, latch, or other storage device. For example, the memory element 120*i* may be implemented as a. D-type flip-flop. The memory element 120*i* may have a reset input, a preset input and a clock input that may receive signals from a global routing pool. An output of the memory element 120*i* may present a registered version of the signal OR_INi to a first input of the multiplexer 122*i*.

The signal OR_INi may be presented to a second input of the multiplexer 122*i*. A configuration signal may be presented to a control input of the multiplexer 122*i*. The multiplexer 122*i* may be configured to select either the un-registered signal OR_INi or the registered signal OR_INi as the. signal MOUTi in response to the configuration signal.

Figure 9:
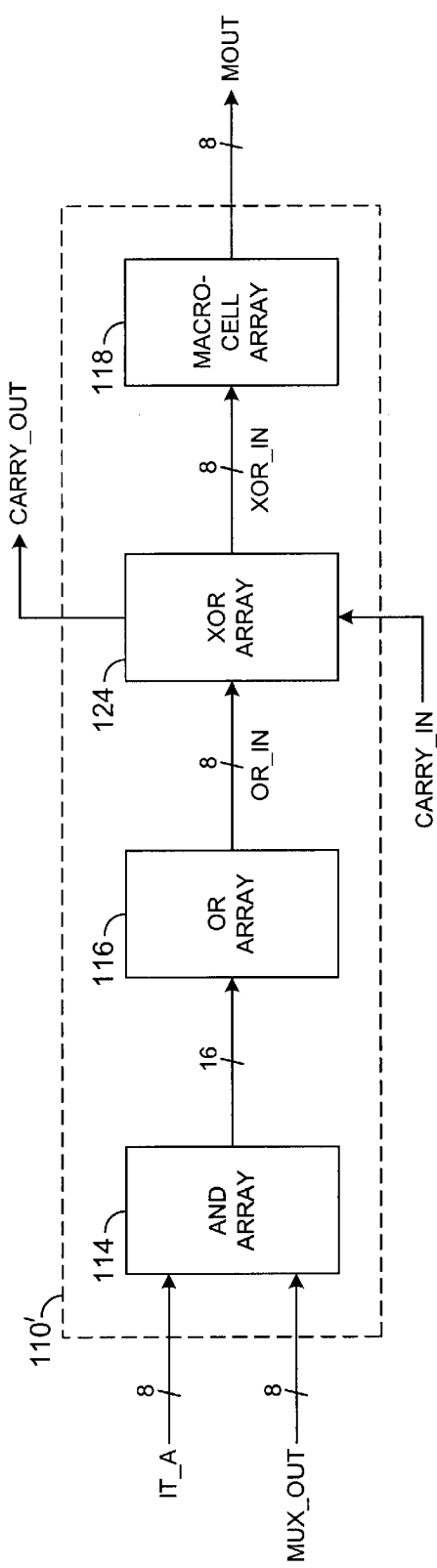
FIG. 9 is a detailed block diagram illustrating an alternative implementation of a programmable logic circuit of FIG. 6.

Referring to FIG. 9, a detailed block diagram of a circuit 110' illustrating an alternative implementation of the circuit 110 of FIG. 7 is shown. The circuit 110' may be implemented similarly to the circuit 110 except that the circuit 110' may further comprise a circuit 124. The circuit 124 may be implemented as an XOR-array. The circuit 124 may be used to couple the OR array 116 and the macrocell array 118. The XOR-array 124 may also be used to implement a carry chain across some or all of the macrocells of a circuit 100'. The XOR-array may have a first input that may receive the signal OR_IN, a second input that may receive a carry signal (e.g., CARRY_IN), a first output that may present a carry signal (e.g., CARRY_OUT), and a second output that may present a signal (e.g., XOR_IN) to the macrocell array 118. The XOR-array 124 may be used to configure a register of each macrocell in the macrocell array 118 as either a D-type or a T-type flip-flop.

Figure 10:
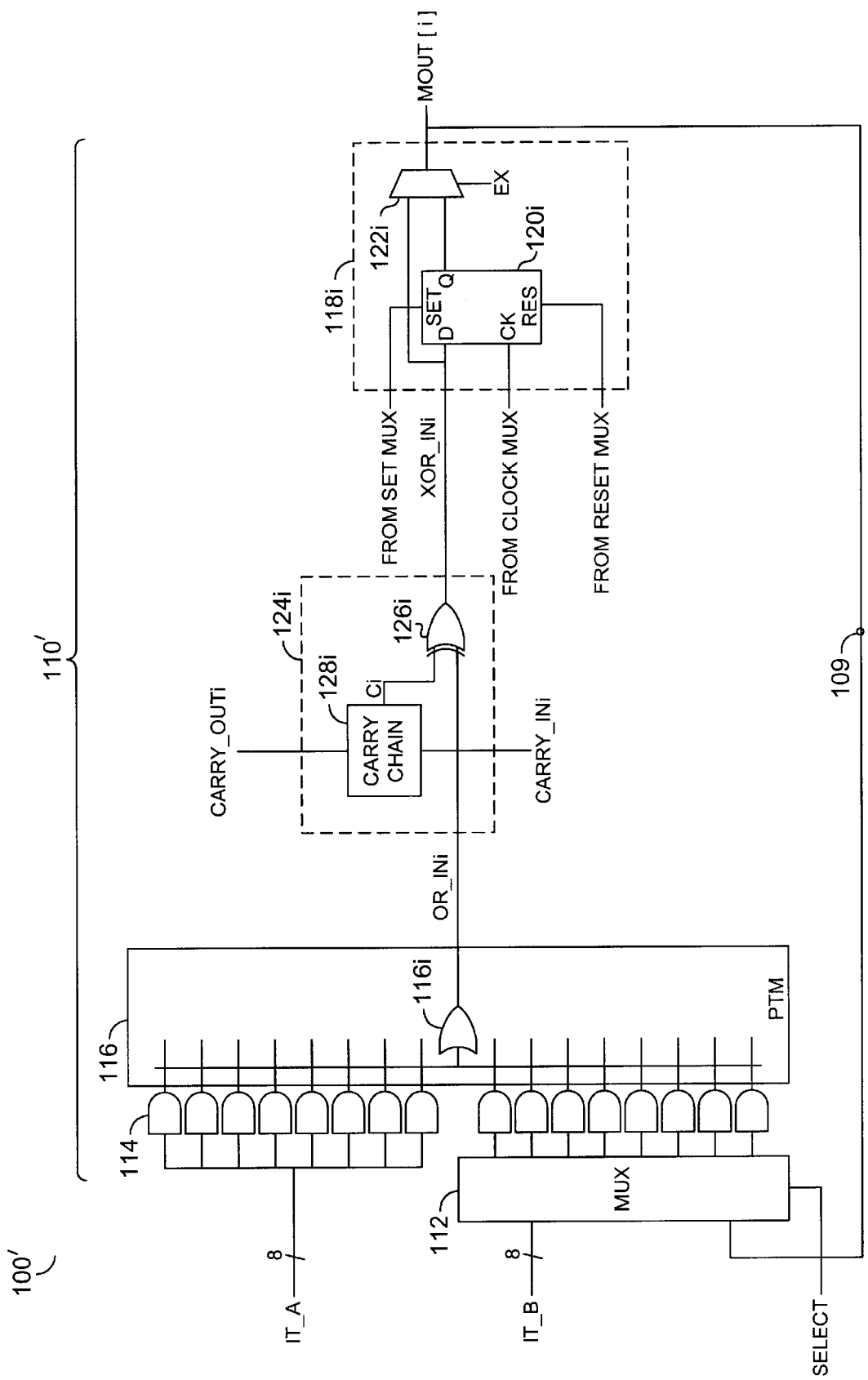
FIG. 10 is a more detailed block diagram illustrating an implementation of the programmable logic circuit of FIG. 9.

Referring to FIG. 10, a more detailed block diagram of a circuit 100' illustrating the logic block of FIG. 6 implemented with the circuit 110' of FIG. 9 is shown. The circuit 110' may be implemented similarly to the circuit 100 (as shown in FIG. 8) except that (i) the output of the OR gate 116*i* may present the signal OR_INi to an input of an element 124*i* of the XOR-array 124 and (ii) an output of the element 124*i* may present a component of the signal XOR_IN (e.g., XOR_INi) to the input of the macrocell 118*i*.

Each XOR-array element 124*i* may comprise an XOR gate 126*i* and a carry chain block (circuit) 128*i*. A description of a carry chain block may be found in U.S. Pat. No. 6,034,546 and a co-pending patent application U.S. Ser. No. 09/587,708, which are hereby incorporated by reference in their entirety. The block 128*i* may have an input that may receive the signal CARRY_IN, an output the may present the signal CARRY_OUT, and an output that may present a signal (e.g., Ci) to a first input of the XOR gate 126*i*. The signal OR_INi may be presented to a second input of the XOR gate 126*i*. The XOR gate 126*i* may be configured to generate the signal XOR_INi in response to the signals OR_INi and Ci.

Figure 11:
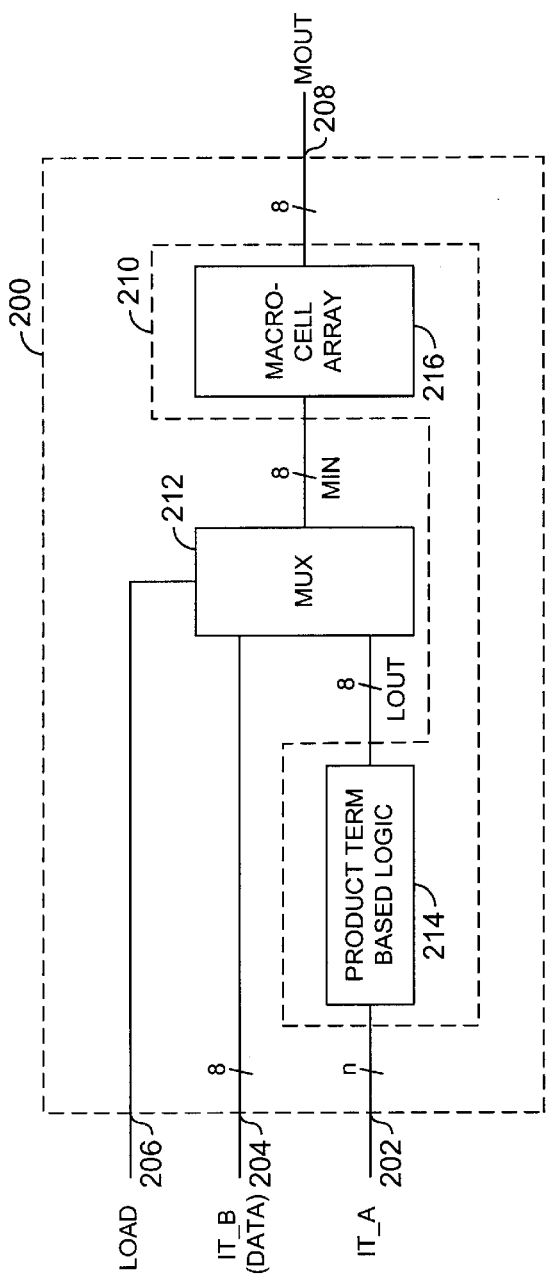
FIG. 11 is a block diagram illustrating an alternative embodiment of the present invention.

Referring to FIG. 11, a block diagram of a circuit 200 illustrating another preferred embodiment of the present invention is shown. The circuit 200 may be implemented, in one example, as a logic block of a complex programmable logic device (CPLD). The circuit 200 may be used to implement loadable state machines using as few as two product terms per macrocell. The state machines that may be implemented may include, but are not limited to, the state machines listed in TABLES 1 and 2 above.

The circuit 200 may have an input 202, an input 204, an input 206, and an output 208. The signal IT_A may be presented to the input 202. The signal IT_B or a signal (e.g., DATA) may be presented to the input 104. A signal (e.g., LOAD) may be presented to the input 206. The signal MOUT may be presented at the output 208. The signals IT_A, IT_B, and LOAD may be received from a programmable interconnect matrix (PIM) or other types of global routing. The signal MOUT may be presented to the PIM or global routing. The signals IT_A, IT_B, DATA, and MOUT may be multi-bit signals. In one example, the signals IT_A, IT_B, DATA, and MOUT may be 8-bit signals. However, other numbers of bits may be implemented. For example, the signal IT_A in this embodiment may be n-bits wide, where n is an integer.

The signals IT_A and IT_B may be input signals (e.g., input terms) of a PLD. The signal DATA may comprise user defined loadable data. The signal MOUT may be an output signal of a PLD. The signal MOUT may be generated by one or more macrocells of a PLD. The signal LOAD may be a user-defined control signal. The circuit 200 may be configured to generate the signal MOUT in response to one or more of the signals IT_A, IT_B, DATA, MOUT, and LOAD.

The circuit 200 may comprise a block (circuit) 210 and a block (array) 212. The block 210 may be a programmable logic circuit. The block 212 may be a multiplexer array. The circuit 210 may be configured to implement user-defined sequential logic and/or combinational logic circuits. For example, the circuit 210 may implement logic circuits in response to a number configuration bits programmed to meet the design criteria of a particular user application. The signal IT_A may be presented to a first input of the circuit 210. A signal (e.g., MIN) may be present to a second input of the circuit 210. The circuit 210 may have a first output that may present a signal (e.g., LOUT) and a second output that may present the signal MOUT. The circuit 210 may be configured to generate the signal LOUT in response to the signal IT_A and the signal MOUT in response to the signal MIN.

The multiplexer array 212 may be implemented, in one example, as an array of eight 2:1 load multiplexers. However, other numbers and types of multiplexers may be implemented accordingly to meet the design criteria of a particular application. Each of the multiplexers may be configured to select between a signal from a logic array (e.g., the signal LOUTi) and a load data term (e.g., the signal DATAi) from the global routing pool, in response to a control signal (e.g., the signal LOAD).

The multiplexer circuit 212 may have a first input that may receive the signal IT_B or DATA, a second input that may receive the signal LOUT, and a third input that may receive the signal LOAD. The third input of the multiplexer circuit 212 may be implemented as a control input. The multiplexer circuit 212 may have an output that may present the signal MIN to the second input of the circuit 210. The signal MIN may be a multi-bit signal. In one example, the signal MIN may be an 8-bit signal. The signal MIN will generally have the same number of bits as either of the signals IT_B, DATA, or LOUT.

The circuit 210 may comprise a circuit (block) 214 and a circuit (array) 216. The circuit 214 may be implemented as a product term based logic circuit. The array 216 may be a macrocell array. The circuit 214 may be configured to generate the signal LOUT in response to the signal IT_A according to user defined logic equations. The signal LOUT may be a multi-bit signal. In one example, the signal LOUT may be an 8-bit signal.

The array of macrocells 216 may be implemented, in one example, as an array of 8 macrocells. The macrocells may be configured to (i) receive the signal MIN and (ii) produce a combinatorial or registered output signal (e.g., MOUT).

Figure 12:
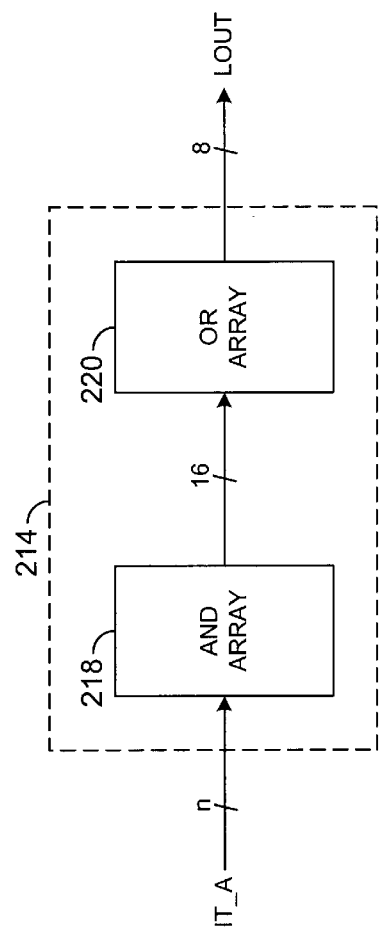
FIG. 12 is a detailed block diagram illustrating an example programmable logic circuit of FIG. 11.

Referring to FIG. 12, a detailed block diagram illustrating an implementation of the circuit 214 of FIG. 11 is shown. The circuit 214 may comprise an AND-array 218 and an OR-array 220. The AND-array 218 may be implemented, in one example, as a 32×16 AND-array. The AND-array 218 may be configured, in one example, to (i) receive generic input terms from a global routing pool (e.g., IT_A), (ii) produce each input signal in a true and a complement form, and (iii) generate a number of unique product terms. In one example, the AND-array 218 may be configured to generate sixteen unique product terms. However, other AND-array sizes and numbers of signals may be implemented accordingly to meet the design criteria of a particular application.

The product terms generated by the AND-array 218 may be presented to the OR-array 220. In one example where the number of product terms is sixteen, the OR-array 220 may be configured to generate eight sum-of-product terms. The sum-of-product terms generated by the OR-array 220 may be presented in the signal LOUT.

Figure 13:
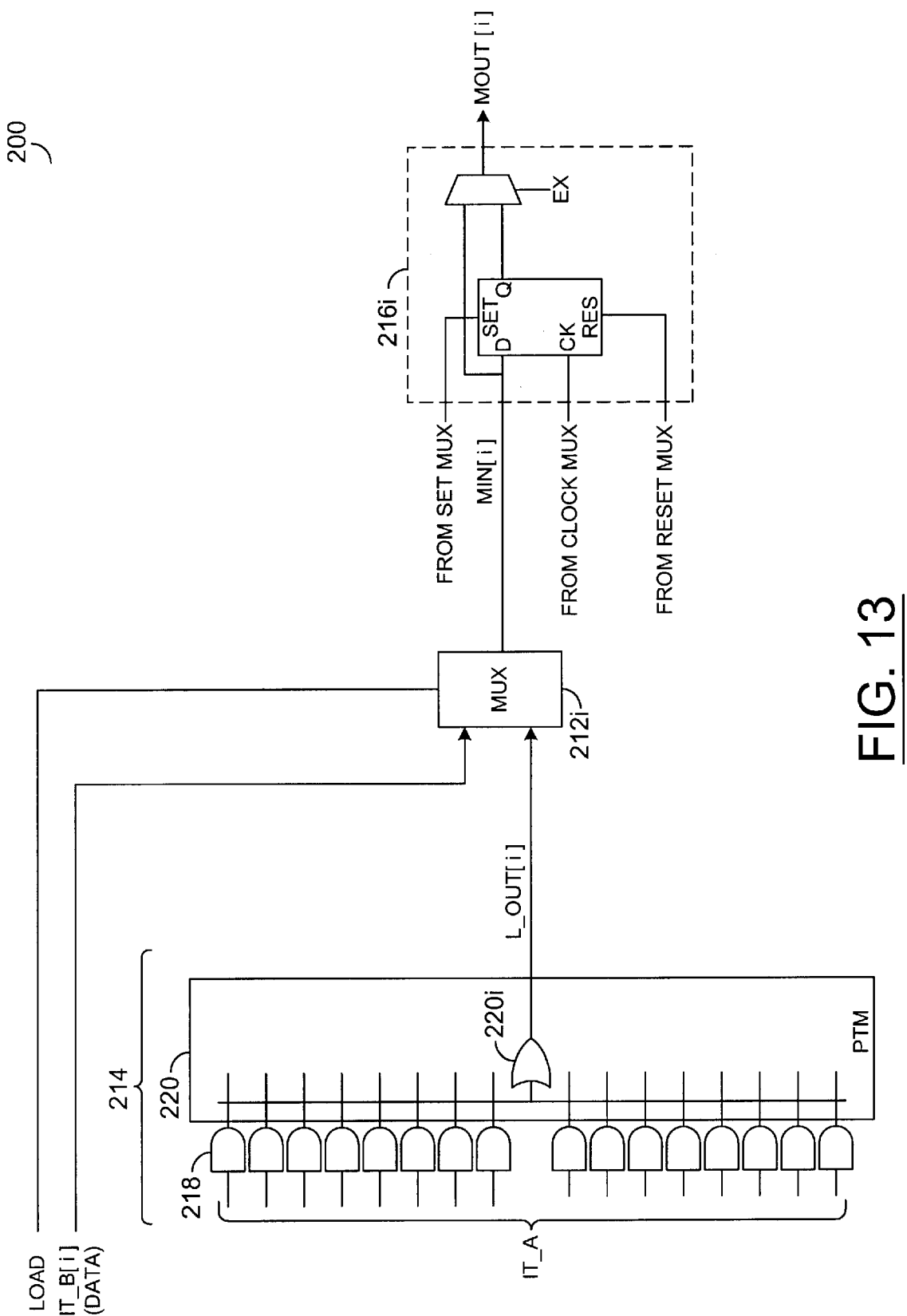
FIG. 13 is a more detailed block diagram illustrating an implementation of the programmable logic circuit of FIG. 12.

Referring to FIG. 13, a more detailed diagram of the circuit 200 is shown. The OR-array 220 generally comprises a number of OR gates. The macrocell array 216 generally comprises a number of macrocells. An output of an OR gate 220$i$ may present a portion of the signal LOUT (e.g., LOUTi) to a first input of a multiplexer 212$i$. The multiplexer 212$i$ may have a second input that may receive a portion of the signal IT_B (e.g., IT_B[i]) or a portion of the signal DATA (e.g., DATA[i]). The signal LOAD may be presented to a control input of the multiplexer 212$i$. The multiplexer 212$i$ may be configured to select either the signal IT_B[i] or the signal DATA[i] as the signal MINi in response to the signal LOAD. The macrocell 216$i$ may be configured to generate a portion of the signal MOUT (e.g., MOUT[i]) in response to the signal MINi. The macrocell 216$i$ may be implemented similarly to the macrocell 118$i$ of FIG. 10.

Figure 14:
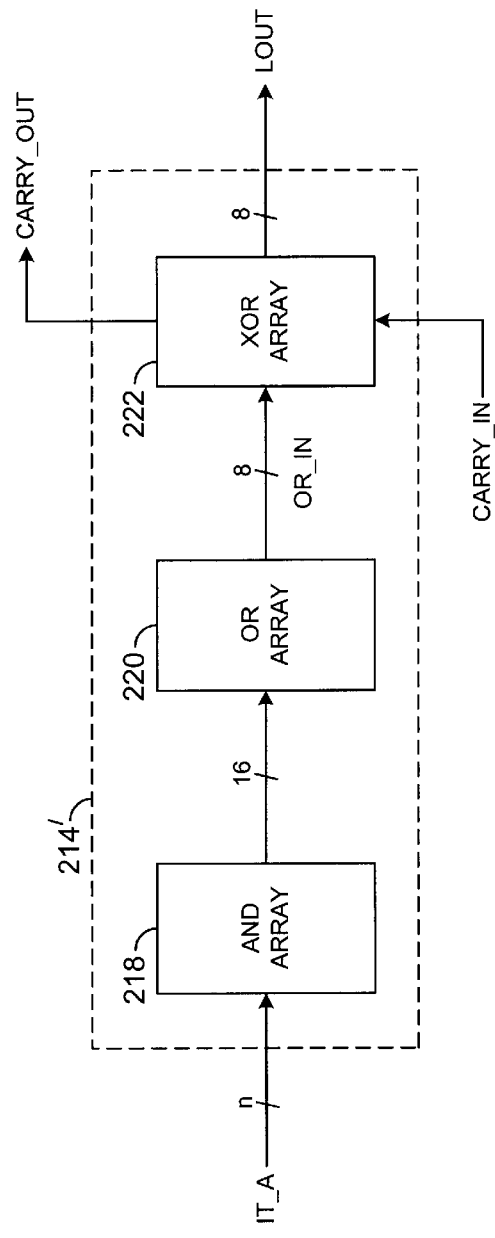
FIG. 14 is a detailed block diagram illustrating an alternative implementation of a programmable logic circuit of FIG. 11.

Referring to FIG. 14, a detailed block diagram of a circuit 214' illustrating an alternative implementation of the circuit 214 of FIG. 11 is shown. The circuit 214' may be implemented similarly to the circuit 214 except that the circuit 214' may further comprise a circuit 222. The circuit 222 may be implemented as an XOR-array. The XOR-array 222 may be used to implement a carry chain across some or all of the macrocells of a circuit 200'. The XOR-array 222 may have a first input that may receive a signal (e.g., OR_IN), a second input that may receive a carry signal (e.g., CARRY_IN), a first output that may present a carry signal (e.g., CARRY_OUT), and a second output that may present the signal LOUT.

Figure 15:
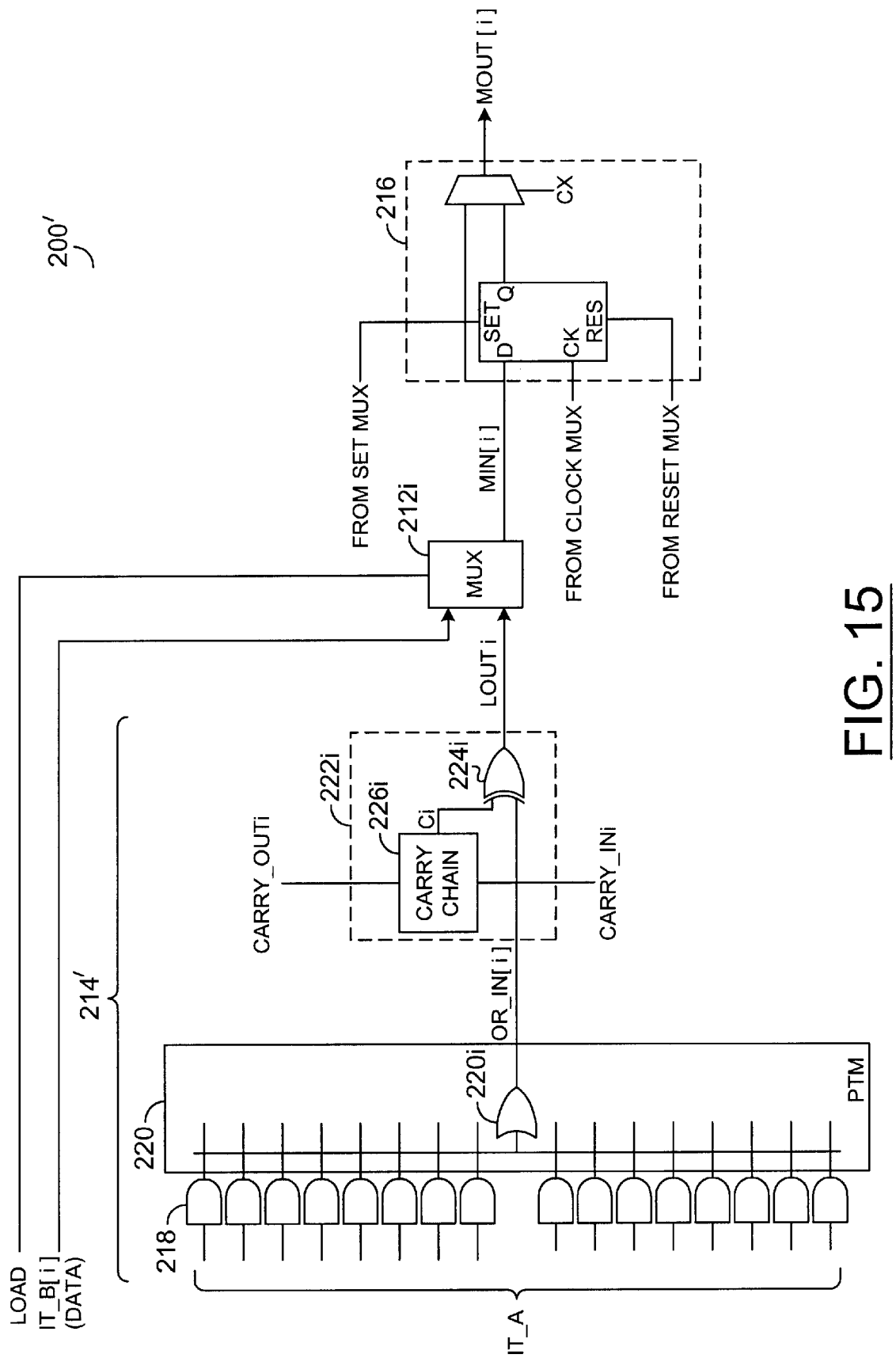
FIG. 15 is a more detailed block diagram illustrating an implementation of the programmable logic circuit of FIG. 14.

Referring to FIG. 15, a more detailed block diagram of a circuit 200' illustrating the logic block of FIG. 11 implemented with the circuit 214' of FIG. 14 is shown. The circuit 200' may be implemented similarly to the circuit 200, except that (i) the output of the OR gate 220$i$ may present the signal OR_INi to an input of an element 222$i$ of the XOR-array 222 and (ii) an output of the element 222$i$ may present a component of the signal LOUT (e.g., LOUTi) to the input of the multiplexer 212$i$.

Each XOR-array element 222$i$ may comprise an XOR gate 224$i$ and a carry chain block (circuit) 226$i$. The XOR-array element 222$i$ may be implemented similarly to the XOR-array element 124$i$ (described in more detail in connection with FIG. 10). The block 226$i$ may have an input that may receive the signal CARRY_INi, an output the may present the signal CARRY_OUTi, and an output that may present a signal (e.g., Ci) to a first input of the XOR gate 224$i$. The signal OR_INi may be presented to a second input of the XOR gate 224$i$. The XOR gate 224$i$ may be configured to generate the signal LOUT[i] in response to the signals OR_INi and Ci.

Figure 16:
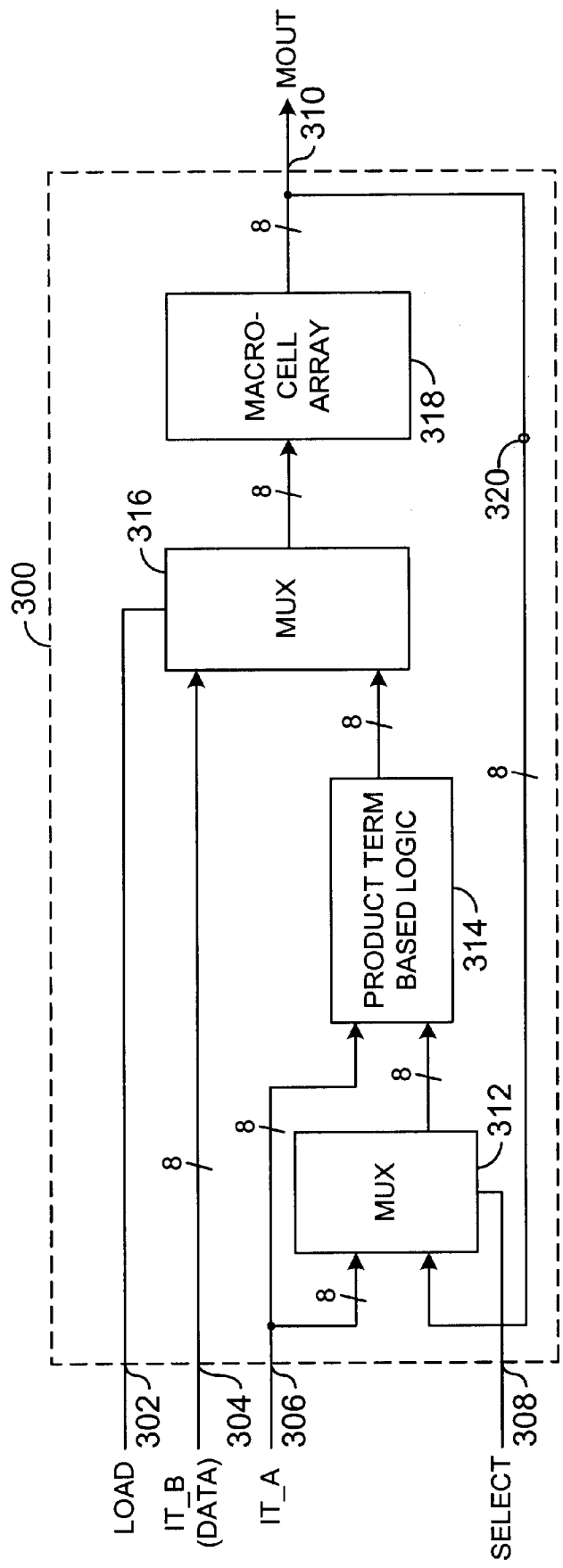
FIG. 16 is a block diagram illustrating another alternative embodiment of the present invention.

Referring to FIG. 16, a block diagram of a circuit 300 illustrating yet another preferred embodiment of the present invention is shown. The circuit 300 may have an input 302 that may receive the signal LOAD. and an input 304 that may receive either the signal IT_B, the signal DATA, or a combination of the signals IT_B and DATA. The signal IT_A may be presented to an input 306 of the circuit 300. The signal SELECT may be presented to an input 308 of the circuit 300. The signal MOUT may be presented at an output 310 of the circuit 300.

The circuit 300 may comprise a multiplexer circuit (block) 312, a product term based logic circuit (block) 314, a multiplexer circuit (block) 316, a macrocell array 318, and a local feedback path 320. The circuit 314 may be implemented similarly to the circuits 214 and 214'. The multiplexer circuit 312 may be implemented similarly to the multiplexer circuit 112.

The array of macrocells 318 may be implemented similarly to the macrocell array 118 and 216. The macrocells may be configured to (i) receive an output of the multiplexer array 316, (ii) produce a combinatorial or registered output signal (e.g., MOUT), and (iii) route the output signal to (a) the global routing pool and (b) the local feedback path 320 to the multiplexer 312.

The operation of the circuit 300 may be separated into two modes: a state machine mode and a combinatorial mode. When the circuit 300 is in the state machine mode, the synchronous load datapath and the local macrocell feedback paths may be enabled. When the circuit 300 is in the combinatorial mode, the number of generic input terms from the global routing pool is generally maximized.

When the circuit 300 is in the state machine mode, a synchronous load function for counters and shift registers may be implemented through the load multiplexer array 316, without consuming additional product terms from the AND-array within the block 314. The control signal LOAD may be routed to a control input of each multiplexer in the array 316. When the signal LOAD is asserted (e.g., a logic HIGH, or "1"), the multiplexer(s) 316 may be configured to select a number of load data bits (e.g., DATA) to be routed to the macrocells 318. In one example, the number of load data bits may be eight. When the signal LOAD is deasserted (e.g., a logic LOW, or "0"), each macrocell 318 may be configured to receive a corresponding logical expression generated from the logic array 314. When the load multiplexer 316 is in the datapath (e.g., the signal LOAD is asserted), the logic equation at the macrocell input for a loadable bidirectional counter may be expressed by the following equation EQ1:

$$T_i = \text{load}*[\text{data}(i) XOR Q_i] + /\text{load}*\text{dir}*Q_{i-1}*Q_{i-2}* \ldots * Q_0 + /\text{load}*/\text{dir}*/Q_{i-1}*/Q_{i-2}* \ldots */Q_0; \quad \text{EQ1}$$

and the logic equation at the macrocell input for a loadable bidirectional shift register may be expressed by the following equation EQ2:

$$D_i = \text{load}*\text{data}(i) + /\text{load}*\text{dir}*Q_{i-1} + /\text{load}*/\text{dir}*Q_{i+1}. \quad \text{EQ2}$$

The above logic equations may be similar to those listed in TABLES 1 and 2 above.

The circuit 300 may provide a multiplexer-based synchronous load datapath that may achieve the correct functionality for any loadable state machine. The dedicated synchronous-load datapath provided by the circuit 300 may also reduce the number of generic input terms and output product terms consumed in the AND-array of the circuit 314 for any loadable state machine. A product term and input comparison for loadable state machines between conventional logic block architectures and the present invention may be summarized as in the following TABLE 3:

TABLE 3

| State Machine Type | Conventional Architecture | | Present Invention | |
|---|---|---|---|---|
| | # PTs/MC | # AND-Inputs | # PTS/MC | # AND-Inputs |
| Loadable n-bit up-counter | 3 | 2n + 1 | 1 | n |
| Loadable n-bit up/down-counter | 4 | 2n + 2 | 2 | n + 1 |
| Loadable n-bit right shift register | 2 | 2n + 1 | 1 | n |
| Loadable n-bit bidirectional shift register | 3 | 2n + 2 | 2 | n + 1 |

The reduction in the number of generic input terms and output product terms realized by the present invention may allow the AND-array of the present invention to be smaller in the input and output directions. For example, having an average of 2 unique inputs and 2 product terms per macrocell, with each input signal delivered in true and complement form, the AND-array of the present invention may be implemented as a 32×16 array.

The state machine bits may be routed back within the logic block via programmable local feedback paths (e.g., the path 109 of FIG. 6 and the path 320 of FIG. 16). For example, as shown in FIG. 8, the macrocell feedbacks may be fed directly into the AND-array 114 through the multiplexer 112. The control inputs of the multiplexer 112 may be driven by logic block configuration bits. The configuration bits may be set by software to route as many local macrocell feedback signals as required by a user's design.

When the logic block 300 is used to implement a purely combinatorial circuit, the synchronous load function through the 2:1 multiplexer array 316 is generally not required. When the multiplexer array 316 is not required, the signal LOAD may be set to the de-asserted state (e.g., disabled) by software. When the the signal LOAD is deasserted, the multiplexer array 316 may present the outputs of the logic array 314 to the inputs of the logic block macrocells 318. The load data lines from the global routing pool (e.g., the signals DATA) may also feed the input multiplexer 312. When the logic block is operating in the combinatorial mode, the load data lines are generally treated as generic input terms (e.g., IT_B) and may be routed to the logic array 314 through the multiplexer 312. Hence, the load data lines are labeled with both IT_B and DATA in FIGS. 6, 11, and 16. The configuration bits driving the control inputs of the multiplexers 112 and 312 may be set according to the user's design, to allow any combination of input terms and macrocell feedbacks to be delivered to the logic arrays 110 and 314, respectively. In addition, input terms from the global routing pool (e.g., the signals IT_A) may be fed directly to the logic arrays 110 and 314. When no local macrocell feedbacks are required to implement combinatorial functions in the logic blocks 100 and 300, the number of input terms to the logic array 110 and 314 from the global routing pool is generally maximized. In one example, the number of input terms may be maximized at 16.

The present invention generally provides an advantage that the required dimensions of the AND-array in a sum-of-products PLD architecture may be reduced. The area and speed cost associated with a single multiplexer 112 or 312, or a single multiplexer 212 or 316 is generally minimal compared to the area and speed cost of a single AND-gate in a product term array 118 or 218. The present invention may significantly reduce die cost and enable lower propagation delays through the logic block.

The programmable local feedback paths may guarantee full routability and faster propagation of the macrocell outputs within the logic block. In addition, the dedicated load control and data paths may reduce the setup time for a synchronous load to occur, since these signals do not have to propagate through the AND-array, the OR-array, and the XOR-array of the logic circuits 110 and 314. The present invention may provide faster, more routable, and more area-efficient state machine implementations in the logic block than can conventional logic blocks.

The multiplexer arrays 212 and 316 may be used to implement a programmable control and data path for synchronous load functions in state machines. The input multiplexers 112 and 312 may be used to implement programmable local macrocell feedback paths in the logic block and allow "stealing" of input terms from unused load data inputs when the synchronous load function is disabled. The multiplexers 112 and 312 and/or 212 and 316 may enable an AND-array of the present invention to be designed with, in one example, 12% fewer input signals and 60% fewer product terms when compared to conventional CPLD logic block architectures. The present invention may reduce the size of the AND-array while maintaining an ability similar to conventional CPLD logic blocks to implement a wide range of combinatorial and sequential logic functions. The present invention may extend the area and speed performance of a CPLD beyond current limits. The present invention may provide a product term based CPLD architecture that may be driven to the same logic densities and operating speeds as a LUT-based FPGA architecture, while maintaining the advantages of lower software overhead and faster compile times.

This invention may provide a programmable logic device (PLD) logic block architecture capable of faster, more routable, and more area-efficient implementations of counters, shift registers, and other state machines as compared to conventional sum-of-products PLD architectures. The present invention may perform input-term multiplexing at macrocell inputs, allowing loadable unidirectional or bidirectional counters and shift registers to be built without consuming additional product terms in generic logic. Macrocell feedbacks may be multiplexed directly into the product term array, which guarantees routability of the state machine outputs and may provide fast feedback paths within the logic block. The present invention may significantly reduce the AND-array size in a sum-of-products architecture, resulting in smaller die area and faster operation compared to existing PLD architectures.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A logic section of a programmable logic device comprising:

a first circuit configured to implement user defined programmable logic, said first circuit generating a plurality of outputs in response to a plurality of first inputs and a plurality of second inputs; and a second circuit configured to generate said plurality of second inputs in response to said plurality of outputs, a plurality of third inputs, and a fourth input.

2. The logic section according to claim 1, wherein said second circuit selects between said plurality of outputs and said plurality of third inputs as said plurality of second inputs in response to said fourth input.

3. The logic section according to claim 1, wherein said second circuit comprises one or more multiplexers.

4. The logic section according to claim 1, wherein said plurality of first inputs and said plurality of third inputs comprise one or more input terms.

5. The logic section according to claim 1, wherein said first circuit comprises a product term array configured to generate a number of product terms in response to said plurality of first inputs and said plurality of second inputs.

6. The logic section according to claim 5, wherein said first circuit further comprises an OR-array configured to generate a number of sum-of-product terms, each in response to one or more of said product terms.

7. The logic section according to claim 5, wherein said first circuit further comprises a product term-allocator configured to allocate said product terms to a plurality of macrocells.

8. The logic section according to claim 1, wherein said first circuit comprises a plurality of macrocells configured to generate said plurality of outputs.

9. The logic section according to claim 1, wherein said first circuit comprises an XOR-array.

10. The logic section according to claim 9, wherein said XOR-array implements a carry chain.

11. An apparatus comprising:

means for implementing user defined programmable logic configured to generate a plurality of outputs in response to a plurality of first inputs and a plurality of second inputs; and means for generating said plurality of second inputs in response to said plurality of outputs, a plurality of third inputs and a fourth input.

12. A method for reducing a number of inputs of a logic section of a programmable logic device comprising the steps of:

(A) receiving a plurality of first inputs and a plurality of second inputs;

(B) combining said plurality of first inputs and said plurality of second inputs according to one or more user defined logic equations to generate a plurality of outputs;

(C) selecting one of said plurality of outputs as one of said plurality of second inputs in response to a first state of a control input; and (D) selecting one of a plurality of third inputs as one of said plurality of second inputs in response to a second state of said control input.

13. The method according to claim 12, wherein step (B) comprises a sub-step of:

(B-1) generating a number of product terms in response to said plurality of first inputs and said plurality of second inputs.

14. The method according to claim 13, wherein step (B) further comprises a sub-step of:

(B-2) generating a sum of product term in response to one or more of said product terms.

15. The method according to claim 14, wherein step (B) further comprises a sub-step of:

(B-3) exclusive-ORing said sum of product term with a carry input.

16. The method according to claim 12, wherein a multiplexer is configured to select between said plurality of outputs and said plurality of third inputs in response to said control input.

17. The method according to claim 12, wherein step (A) comprises the sub-step of:

(A-1) configuring a programmable interconnect matrix or routing structure of said programmable logic device.

18. The method according to claim 12, wherein step (B) comprises the sub-step of:

(B-1) generating a true and a complement form of each of said plurality of first inputs and each of said plurality of second inputs.

19. The method according to claim 12, wherein step (B) comprises the sub-step of:

(B-1) generating said plurality of outputs with a plurality of macrocells of said programmable logic device.

20. The method according to claim 14, wherein step (B) further comprises the sub-step of:

(B-3) generating said plurality of outputs in response to a plurality of said sum of product terms.

* * * * *